United States Patent [19]
Van Ruyven

[11] Patent Number: 4,476,563
[45] Date of Patent: Oct. 9, 1984

[54] SEMICONDUCTOR LASER HAVING AT LEAST TWO RADIATION BEAMS, AND METHOD OF MANUFACTURING SAME

[75] Inventor: Lodewijk J. Van Ruyven, Eindhoven, Netherlands

[73] Assignee: U.S. Philips Corporation, New York, N.Y.

[21] Appl. No.: 352,502

[22] Filed: Feb. 25, 1982

[30] Foreign Application Priority Data

Mar. 23, 1981 [NL] Netherlands ................ 8101409

[51] Int. Cl.$^3$ ............................................. H01S 3/19
[52] U.S. Cl. ....................................... 372/50; 357/17; 372/46; 372/47
[58] Field of Search ................ 372/50, 23, 46, 47; 357/17

[56] References Cited

U.S. PATENT DOCUMENTS 3,961,996 6/1976 Namizaki et al. .................. 372/47
4,280,108 7/1981 Scifres et al. ...................... 372/47
4,318,059 3/1982 Lang et al. ......................... 372/47

OTHER PUBLICATIONS

Sakai et al., "Dual Wavelength InGaAsP/InP TJS Lasers", Electronics Letters, vol. 18, No. 1, pp. 18–20, Jan. 7, 1982.

Primary Examiner—James W. Davie
Attorney, Agent, or Firm—Robert T. Mayer; Steven R. Biren

[57] ABSTRACT

A semiconductor laser device has a semiconductor body in which two or more lasers are provided which can generate substantially parallel radiation beams of preferably different frequencies which are situated close together. According to the invention, the semiconductor body has at least one semiconductor laser of the double hetero-junction type (DH-type) comprising a plurality of semiconductor layers with a radiating p-n junction parallel to the semiconductor layers and at least one semiconductor laser of the TJS ("Transverse Junction Stripe") type, the p-n junction surface of which is transverse to that of the DH-laser. The device comprises a layer structure having at least two active layers, each between two passive layers. One laser is formed in a mesa-shaped part of the body which comprises both active layers, the other in an adjacent part in which the uppermost active layer is absent. The TJS-laser is preferably provided in the last-mentioned part. More than two lasers may also be provided.

13 Claims, 12 Drawing Figures

SEMICONDUCTOR LASER HAVING AT LEAST TWO RADIATION BEAMS, AND METHOD OF MANUFACTURING SAME

BACKGROUND OF THE INVENTION

The invention relates to a semiconductor laser device for generating radiation beams which are substantially parallel to each other, comprising a semiconductor wafer having a first and a second major surface and comprising, between said major surfaces and beside each other, at least a first part and an adjoining second part, which semiconductor wafer is further bounded by two substantially parallel reflective side faces extending perpendicularly to the direction of said radiation beams and comprises a substrate of a first conductivity type adjoining the second major surface, on which substrate are provided successively a first passive layer of the first conductivity type, a first active layer and a second passive layer. These layers, together with the substrate, extend in both parts of the semiconductor wafer, and only in the second part there are successively provided on the second passive layer a second active layer and a third passive layer, each active layer being provided between passive layers having a larger forbidden band gap. The first active layer comprises a pn-junction in said first part and the second active layer comprises a pn-junction in said second part, each of which pn-junctions emits, at sufficiently high forward current one of said radiation beams. In the device, the substrate is connected to a first electrode, the second passive layer is connected to a second electrode, and the third passive layer is connected to a third electrode.

The invention furthermore relates to a method of manufacturing the device.

It is to be noted that when an active layer is said to comprise a p-n junction, this pn-junction may be present either inside the active layer or at the interface between the active layer and an adjoining passive layer. Furthermore, substantially parallel radiation beams are to be understood to mean radiation beams the center lines of which extend substantially parallel to each other but which in themselves may be more or less diverging.

A semiconductor laser device as described above is known from Applied Physics Letters, vol. 35, No. 8, Oct. 15, 1971, pp. 588–589.

For various application, it is of importance to have two mutually substantially parallel laser beams at a small distance from each other.

A first known application is found in devices for optical communication where light signals of a laser source are coupled into an optical fiber for transmitting information which is read out at the other end of the optical fiber by means of a radiation detector. The quantity of information (for example the number of telephone calls) which can be transported simultaneously through the same optical fiber can be doubled by using a radiation source which transmits two or more different frequencies; this is known as wavelength multiplexing. For that purpose, for example, the light of each of two lasers of different wavelengths may be coupled into a separate optical fiber and the light of the two fibers may then be combined in one single optical fiber by means of a mixing device. However, this mixing process results in considerable losses. If it were possible to couple the light of the two lasers directly in one single optical fiber, these losses could be avoided. However, this can be done only when the radiation sources are situated very close together.

Another application may be found in providing information on disks by optical methods ("digital optical recording" or DOR), in which method holes are burned in a reflecting layer by means of a laser beam. In order to check the correctness of the information thus written, it is read out by means of a second laser which is mounted behind the first laser. The two radiation beams may have the same frequencies, although for reasons of circuitry for a good separation of the signal it is desirable that that beams have different frequencies. This may be done by means of a second laser mounted in a separate optical mounting (or "light pencil") which solution, however, involves an expensive construction. The radiation beam of one single laser can also be split by means of an optical system into a "write" beam and a "read" beam. However, this is not economical since a large energy input is required for "writing" and by splitting the radiation beam the power of the laser must be increased even more, which involves problems with repsect to cooling and cost. Finally, two separate lasers mounted on one single cooling plate may also be used. For this purpose, however, the lasers must be aligned very precisely relative to each other, and the minimum distance between the emissive facets is at least equal to the width of each of the semiconductor wafers.

The semiconductor laser device described in Applied Physics Letters, 35 (8), Oct. 15, 1979, pp. 588–589 comprises in the same semiconductor body two lasers beside each other of the so-called double hetero junction type (DH lasers) with mutually parallel-extending radiating p-n junctions. However, for use in the above-mentioned applications this device has various disadvantages.

First of all, the series resistance of at least one of the integrated lasers is high since the current through said laser must flow through one of the passive layers over a comparatively large distance.

Furthermore, as is also noted in the article, the emissive facets are so far apart that it is difficult to couple the two laser beams directly in one optical fiber. This disadvantage applies to an even greater extent when said optical fiber is a so-called "monomode" fiber such as is often desired particularly in optical communication, since said fibers have very small diameters.

SUMMARY OF THE INVENTION

One of the objects of the invention is to remove or at least considerably reduce the drawbacks associated with known semiconductor laser devices.

The invention is based inter alia on the recognition that the end in view can be reached the integration of two lasers of different structures, the p-n junction surfaces of which are not parallel, in such manner that the technology used for the manufacture of the conventional double hetero-junction laser with a p-n junction parallel to the direction of the layer can be used for the construction of the required layer structure of the device.

For that purpose, a semiconductor laser device according to the invention is characterized in that the third passive layer is of the second conductivity type and that in one of said parts of the semiconductor wafer a region is formed locally which extends from the first major surface through the uppermost passive layer, the adjoining active layer and a part of the underlying passive layer, the three layers all having the same conductivity type which is opposite to that of said region, said region forming with the remaining part of the adjoining active layer the first p-n junction extending transversely to said active layer and to said side surfaces, the second p-n junction extending parallel to the second major surface and comprising a strip-shaped active region also extending transversely to the side surfaces.

The semiconductor laser device according to the invention comprises two lasers of essentially different construction in the same semiconductor wafer. namely a "conventional" double hetero-junction (DH) laser, and a so-called TJS ("Transverse Junction Stripe") laser. This latter laser is known per se from U.S. Pat. No. 3,961,996.

An important advantage of devices in accordance with the invention is that the radiating facets of both lasers can be provided very close together. As a result of this the radiation beams originating from both lasers can be coupled directly in one single optical fiber without an intermediate optical mixing device. Such a small distance between the emissive facets is technologically realizable in that the surface of the radiating p-n junction of the TJS laser is perpendicular to the active layer and can as a result be provided very close to the DH laser in a manner so as not to be hindered by insulation regions serving for the lateral confinement of the active region.

The device according to the invention is also very suitable for the already-mentioned use of providing information on disks by optical methods (DOR), in which a "write" laser of a comparatively large power is necessary to write the information while for reading for control purposes a "read" laser of a much smaller power is sufficient, the so-called DRAW (Direct Read And Write)-system. As a result of the very narrow active p-n junction, the width of which is equal to the thickness of the active layer, the TJS laser requires little power as compared with the adjacent DH-laser, however, power is sufficient for the reading function, while its low dissipation simplifies the cooling problem.

Furthermore, the radiation beam of a TJS-laser shows substantially no astigmatism so that no external correction lens is necessary for said laser, which simplifies the construction. Since the current for the TJS-laser passes substantially only through the active layer, the efficiency of said laser moreover is very favorable.

As regards the manufacture of the device in accordance with the invention it is a very important advantage that it may be manufactured from a layer structure as is usually used for the manufacture of a double hetero-junction laser, with the only difference being that two extra layers are grown. After completion of the layer structure the DH-laser can be finished in the usual manner, while for realizing the TJS-laser only an etching step and a diffusion step are necessary, at least in the case when the said region is formed by diffusion. As a matter of fact, said region can also be formed differently, for example, by ion implantation, or by contour epitaxy, or by a combination of one of these techniques with a diffusion step.

According to a first important preferred embodiment, the first active layer and the second passive layer are of the first conductivity type, while the said region is of the second conductivity type and extends locally in the first part of the semiconductor wafer through the second passive layer, the first active layer and a part of the first passive layer. Starting from a substrate (usually N-type) which is usual for making conventional double hetero-junction lasers and on which two extra layers are grown (the first active layer and the second passive layer), a layer structure may be grown which is generally used for said laser, after which in the first part of the plate the uppermost layers are etched away down to the second passive layer and by local use of, for example, a double zinc diffusion the region of the second conductivity type is formed to obtain the TJS-laser.

In a second preferred embodiment the second passive layer and the second active layer are both of the second conductivity type, while the said region is of the first conductivity type and extends locally in the second part of the semiconductor wafer through the third passive layer, the second active layer and a part of the second passive layer. In contrast with the preceding embodiment, the TJS-laser in this embodiment is present in the mesa-shaped projecting part of the semiconductor plate. A practical disadvantage of this embodiment is that in practice gallium arsenide and mixed crystals thereof with other III-V elements are often used as semiconductor materials, while for the formation of diffused regions therein zinc is used as the best suitable activator. Since zinc in these materials is an acceptor, the substrate will have to be p-type conductive when using these materials in forming the said region by diffusion. Due to the smaller mobility of holes with respect to electrons, the substrate can easily form too high a series resistance. When, however, the said region is not manufactured by diffusion but by means of another method, for example, contour epitaxy or ion implantation, the said region may be made n-type conductive. The substrate may then also by n-type conductive so that the said disadvantage of high series resistance in this embodiment is avoided.

According to a further preferred embodiment the semiconductor laser device is characterized in that the strip-shaped active region of the second p-n junction is bounded by proton-bombarded, electrically substantially insulating zones extending at least into the proximity of the associated active layer.

The invention furthermore relates to a method of manufacturing the semiconductor laser device, which method is characterized in that at least a first passive layer of the first conductivity type, a first active layer of other first conductive type, a second passive layer of the first conductivity type, a second active layer, and a third passive layer of the second conductivity type are provided successively on a substrate of a first conductivity type by epitaxial growth, that the third passive layer, the second active layer and at most a part of the second passive layer are then removed over a part of the surface of the resulting layer structure, after which at least said surface part is coated with a masking layer which has a diffusion window, and a dopant determining the second conductivity type is then indiffused via said window in two steps, in which in a first diffusion step a non-degenerate doped region is formed which extends through the second passive layer and the first active layer over part of the thickness of the first passive layer and in a second, less deep diffusion step a part of said region extending through the first active layer is converted into degenerated doped mterial.

BRIEF DESCRIPTION OF THE DRAWING

The invention will now be described in greater detail with reference to several examples and the drawing, in which.

DESCRIPTION OF THE PREFERRED EMBODIMENTS

Figure 1:
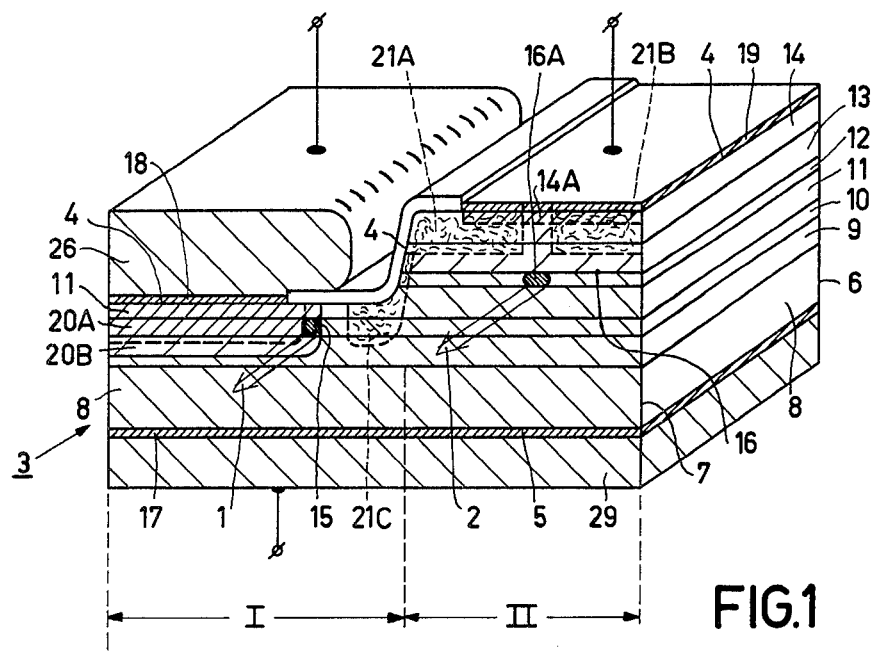
FIG. 1 shows partly in cross-section and partly in perspective a semiconductor laser device according to the invention.

FIG. 1 shows partly in cross-section and partly in perspective a semiconductor laser device according to the invention. The device serves to generate two mutually substantially parallel radiation beams 1 and 2, see FIG. 1, which in this example have different frequencies. The device comprises a semiconductor wafer 3 having a first major surface 4 and a second major surface 5. The semiconductor wafer 3 comprises, between the major surfaces 4 and 5 and beside each other, a first part I and an adjoining part II. The semiconductor wafer 3 is further bounded by two substantially parallel reflective side surfaces 6 and 7—the front and rear faces in FIG. 1—extending perpendicularly to the direction of the radiation beams 1 and 2. The semiconductor body of the device comprises a substrate 8 of a first conductivity type adjoining the second major surface 5. In this example the substrate 8 is of n-type gallium arsenide having a doping of $10^{18}$ silicon atoms per cm$^3$, although in principle a p-type substrate might also be used. A first passive layer 9 of the first conductivity type, in this case n-conductivity type, a first active layer 10 and a second passive layer 11 are provided successively on the substrate 8 and extent together with the substrate 8 in the said two parts I and II of the semiconductor wafer 3.

Furthermore, and only in the second part II of the semiconductor wafer, a second active layer 12 and a third passive layer 13 are provided successively on the second passive layer 11. The active layers 10 and 12 are each present between passive layers (9 and 11, and 11 and 13, respectively), with a larger forbidden band gap. Furthermore the first active layer 10 comprises in the first part I a p-n junction and the second active layer 12 comprises in the second part II a p-n junction 16. Each of these p-n junctions 15 and 16 can emit one of the said radiation beams (p-n junction 15 beam 1 and p-n junction 16 beam 2) when the current in the forward direction is sufficiently high. For that purpose, the substrate 8 is connected to a first electrode 17, the second passive layer 11 is connected to a second electrode 18 and the third passive layer 13 is connected to a third electrode 19 (via a semiconductor contact layer 14). The contact layer 14 serves to promote a good ohmic contact with the third passive layer 13 but is not strictly necessary.

According to the invention, the third passive layer 13 is of the second conductivity type, in this example of the p-type. Furthermore according to the invention a region 20 is formed locally in one of the said parts of the semiconductor wafer, in this example in the first part I, and extends from the first major surface 4 through the uppermost passive layer 11, the adjoining active layer 10 and a part of the underlying passive layer 9. According to the invention the three layers 9, 10 and 11 all have the same conductivity type, opposite to that of the region 20. The region 20 forms, with the remaining part of the active layer 10, the first p-n junction 15 which extends transversely to said layer 10 and to the side surfaces 6 and 7 and continues through the layers 9 and 11 and bounds the region 20. The second p-n junction 16 extends parallel to the second major surface 5 and has a strip-shaped active region 16A which also extends transversely to the side surfaces 6 and 7.

In the embodiment according to this example the first active layer 10 and the second passive layer 11 are both of the first n-conductivity type while the region 20 is of the second p-conductivity type and in the first part I of the semiconductor plate locally extends through the second passive layer 11, the first active layer 10 and a part of the first passive layer 9. The region 20 extends from the edge of the semiconductor wafer 3, is spaced apart from the second part II of the semiconductor wafer and forms there the first p-n junction 15.

In the example shown in FIG. 1 the following compositions and dopings of the various layers were used:

| Layer | Material | thickness (μm) | doping | atoms/cm$^3$ |
|---|---|---|---|---|
| 8(substrate) | N GaAs | 90 | Si | $10^{18}$ |
| 9 | N Al$_{0.5}$Ga$_{0.5}$As | 5 | Te | $10^{17}$ |
| 10(active) | N Al$_{0.15}$Ga$_{0.85}$As | 0.2 | Te | $10^{18}$ |
| 11 | N Al$_{0.5}$Ga$_{0.5}$As | 1.5 | Te | $10^{17}$ |
| 12(active) | Al$_{0.05}$Ga$_{0.95}$As | 0.2 | undoped | |
| 13 | P Al$_{0.4}$Ga$_{0.6}$As | 2 | Ge | $5 \times 10^{17}$ |
| 14 | P GaAs | 1 | Ge | $2 \times 10^{18}$ |

The width of the strip-shaped p-n junction 15 of the TJS-laser formed in part I is determined by the thickness of the layer 10 and thus is only 0.2 μm. The strip-shaped active region 16A of the p-n junction 16 is bounded by proton-bombarded, electrically substantially insulating zones 21A and 21B (shown in broken lines in the figures) extending into the proximity of the associated active layer 12. In this example such an insulating zone (21C) is also present between the region 20 and the adjoining part II of the semiconductor wafer. The region 21C extends into the proximity of the active layer 10 and promotes the lateral electrical separation of both lasers, but is not strictly necessary.

Upon applying a sufficiently high voltage in the forward direction between the electrodes 17 and 18 and between the electrodes 17 and 19, coherent light beams (beam 1 having a wavelength of about 780 nm and beam 2 having a wavelength of about 850 nm) are emitted by the TJS laser and the DH-laser, respectively. The radiating facets, shaded dark in FIG. 1, may be provided very closely together, for example, at a mutual distance of 10 μm or less. The beams 1 and 2 then are so close together that they can be directly coupled in one optical fiber without a mixing device, so as to transfer information via two different wavelengths.

In applications for the manufacture of optical information disks (DOR), the beam 2 originating from the DH-laser with comparatively large power may be used for burning the required holes in the reflective layer of the plate with, for example, pulses of 60 mW with a duration of, for example, 50 ns, while the beam 2 of much smaller power may be used for the immediate subsequent reading and checking by causing the beam 1 to reflect against the "written" reflective surface of the DOR plate and reading the reflected beam by means of a detector.

According to the invention, the semiconductor laser device of FIG. 1 may be manufactured as follows. The starting material is a substrate of n-type gallium-arsenide with a thickness of 350 μm, a surface oriented according to the (100) crystal orientation, and a doping of $10^{18}$ silicon atoms per cm$^3$. In a manner conventionally used in semiconductor technology the layers 9 to 14 described above are successively grown from the liquid phase on said substrate. For the details of said method, which are of no significance for the invention, reference may be made, for example, to the book "Crystal Growth from High-Temperature Solutions" by D. Elwell and J. J. Scheel, Academic Press 1975, pp. 433.467.

Figure 2:
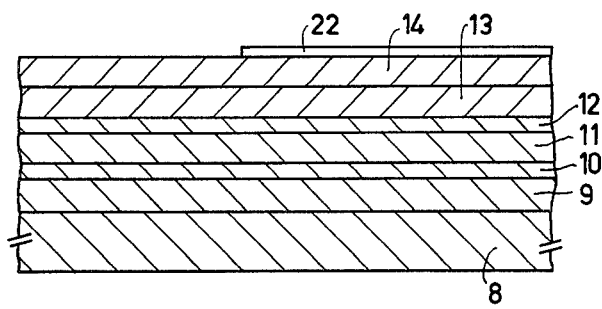
FIGS. 2 to 8 are diagrammatic cross-sectional views of the device shown in FIG. 1 in successive stages of manufacture.

An insulating masking layer 22, for example of silicon oxide, is then vapor-deposited on the surface of the contact layer 14 to a thickness of a few tenth of a μm. Silicon nitride, aluminum oxide or another electrically insulating material may also be used instead of silicon oxide. An etching mask is formed from said silicon oxide layer 22 by means of known photoetching methods, see FIG. 2.

Figure 3:
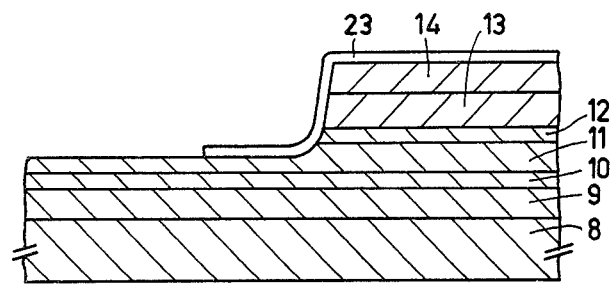
Figure 4:
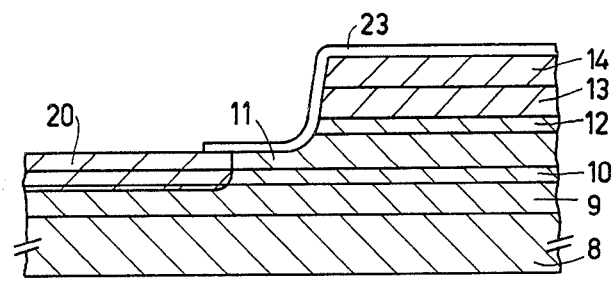

Over the part of the surface not covered by the mask 22, the layers 14, 13 and 12 and a small part of the layer 11 are then removed by etching. For etching gallium-arsenide and gallium aluminum arsenide various selective or non-selective etchants are known which are described, for example, in the article by Tijburg and van Dongen, "Selective Etching of III-V compounds with Redox Systems" in Journal of the Electrochemical Society, vol. 123, No. 5, May 1976, pp. 687-691. After removing the mask 22, a fresh masking layer 23, for example also of silicon-oxide, or of another insulating material, is vapor-deposited, see FIG. 3. The layer 23 is partly removed by photoetching so that beside the mesa an edge of approximately 5 μm width remains. A first zinc diffusion is then carried out (see FIG. 4) so that a p-type region 20 is formed. This region extends, at least after the subsequent thermal treatments, through the layers 11 and 10 and through a part of the layer 9.

A part of the masking layer 23 is then etched away also on top of the mesa, up to a distance of approximately 5 μm from the edge of the mesa. A second zinc diffusion with smaller depth and with a higher zinc concentration than the first zinc diffusion is then carried out, so that within the region 20 a part 20A (see FIG. 5) with higher doping concentration is formed, and a highly doped region 14A is also formed in the contact layer 14, which facilitates contacting. The zinc diffusion penetrates deeper into the layers 9, 10 and 11 than into the layer 14 because, as is known, the diffusion coefficient of zinc at the same temperature is larger in gallium aluminum arsenide than in gallium arsenide.

As a result of the double zinc diffusion the region 20 consists of a degenerate doped part 20A and a lower non-degenerate doped part 20B adjoining the p-n junction 15. The active radiating part of the TJS-laser is bounded laterally by the P+P junction between the parts 20A and 20B and by the p-n junction 15, and is approximately 1 μm wide.

Figure 5:
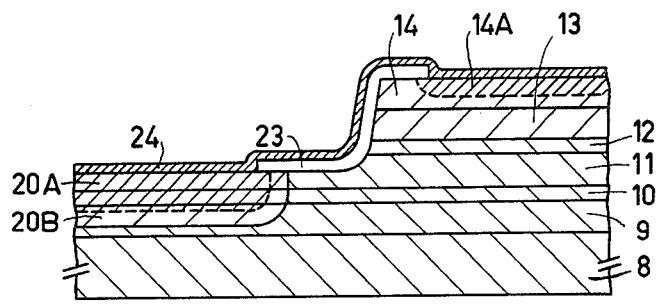
Figure 6:
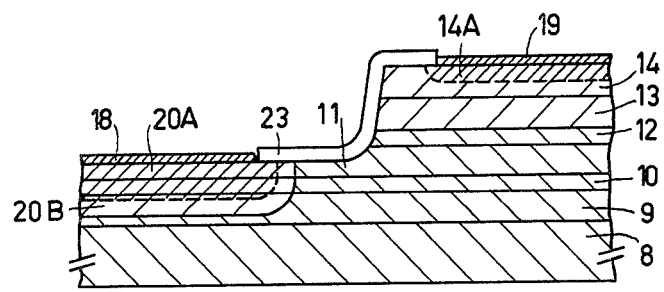

A metal layer 24 is then vapor-deposited over the whole upper surface (see FIG. 5). This may be a simple metal layer, but in this example the layer 24 consists of successively a 50 nm thick layer of chromium, a 100 nm thick layer of platinum and a 50 nm thick layer of gold. By means of an etchant which, when the layer 23 is a silicon oxide layer, may consist of a solution of ammonium-bifluoride in water, the uppermost surface layer of the layer 23 is then etched away together with the part of the metal layer 24 present thereon so that the separated electrode layers 18 and 19 are formed.

Figure 7:
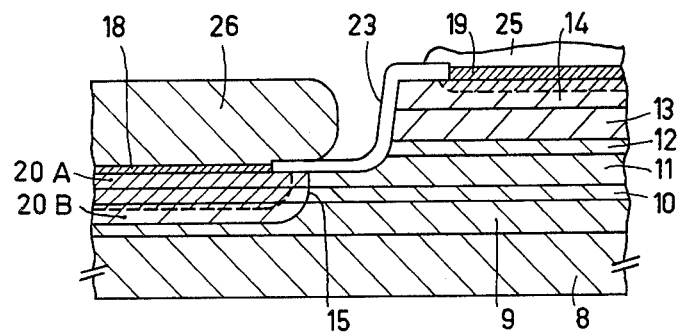

The metal layer 19 on top of the mesa is then covered, for example, by means of a photolacquer layer 25 which need not be aligned accurately. A gold layer 26 is then grown (see FIG. 7) in the usual manner by electro-plating on the exposed part of the metal layer 24 beside the mesa, to a thickness of approximately 3 μm which gold layer also grows laterally over a distance of a few μm on the insulating layer 23 and extends to beyond the p-n junction 15.

Figure 8:
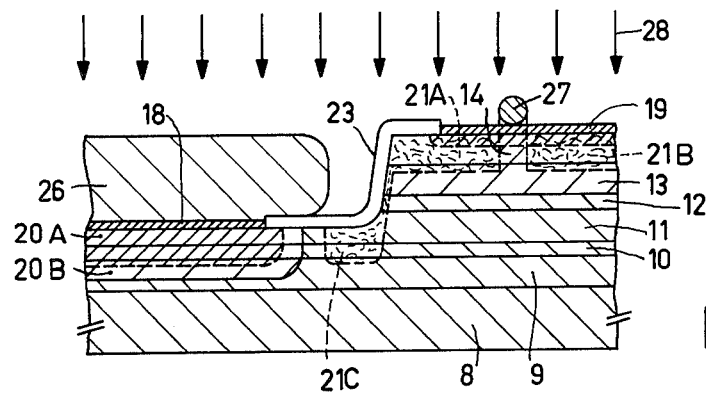

The photolacquer layer 25 is then removed and a wire mask, for example a tungsten wire 27 having a diameter of 5 μm, is provided on the upper surface of the mesa. The upper surface is then bombarded with protons 28 (see FIG. 8) with an energy of 200 keV and a dose of $10^{15}$ protons per cm$^2$. As a result of this electrically substantially insulating zones 21A, B and C are formed in the semiconductor material, shown in broken lines in FIG. 8. The zones extend down to a depth of approximately 1.5 μm from the surface. The tungsten wire 27 and the gold contact 26 serve as a mask in this proton bombardment.

The semiconductor wafer is then reduced to an overall thickness of approximately 100 μm by grinding and etching. The lower side of the wafer is then covered with a metal layer 17, for example a gold germanium nickel layer, which is then alloyed, the metal layers 18 and 19 being alloyed simultaneously.

Mutually parallel cleavage surfaces are then provided at a mutual distance of approximately 250 μm. They may be covered, if desired, with a protective dielectric layer but at least one of the cleavage faces must be transparent to the emitted radiation.

The device may then be mounted in various manners and be provided in an envelope dependent on the use. FIG. 1 shows how the device with the substrate 8 and the metal layer 17 is soldered on a cooling plate 29, for example of copper. By means of supply wires provided on said cooling plate 29, on the electrode layer 19 and on the gold contact 26, the two lasers can be operated independently of each other.

When, as in this example, the gold contact 26 with its upper surface is approximately level with the upper surface of the mesa, the cooling plate may in principle also be provided on the upper side. In that case, it should be ensured, in order to be able to operate the lasers independently of each other, that the two parts of the cooling plate which contact the electrode 19 and the gold contact 26 are electrically insulated from each other.

Although the above-described construction is to be preferred in most cases, many other embodiments are possible as will now be described in detail with reference to a few examples.

First of all it may be noted that by suitable choice of the semiconductor materials of the various layers the wavelength of the beams 1 and 2 can be chosen within certain limits by those skilled in the art. It may be ensured, for example, that the wavelength of the TJS laser is not smaller but larger than or equal to that of the DH-laser. The metal layers and insulating layers chosen in the example of FIG. 1 may also be of a composition differing from the one described. If desired, the gold contact 26 may be omitted, provided the region 20 is screened from the proton bombardment in a different manner.

Furthermore, instead of the proton-bombarded strip laser used in this case, another conventional double hetero-junction laser having its p-n junction parallel or substantially parallel to the semiconductor layers may also be used. Examples of such lasers are available in the technical literature; reference may be made to the article by D. Botez in the Journal of Optical Communications, 1980, pp. 42–50, in particular FIGS. 1, 3a, c, d, e and 9.

The region 20 may also be obtained in a manner other than by diffusion, for example, by contour epitaxy, in which first the volume to be occupied by the region 20 is etched away and is then filled by epitaxial growth. Furthermore, the zinc-diffused zone 14A is not strictly necessary. This zone may also be provided in a separate diffusion step. Otherwise, the layer 14 as a whole only serves for contacting and in the presence of an electrode layer which forms a good ohmic contact of sufficient low resistance on the layer 13, it might also be omitted.

Figure 9:
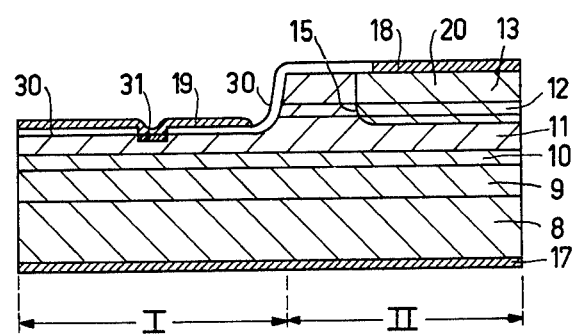
FIGS. 9 and 10 are diagrammatic cross-sectional views of other embodiments of the device in accordance with the invention.
Figure 10:
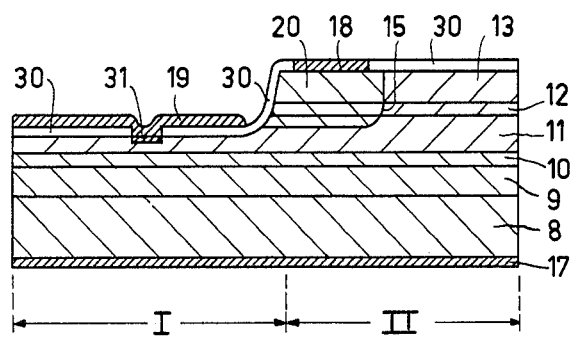

However, structures differing from the embodiment shown in FIG. 1 may in certain circumstances also be of advantage. For example, the second passive layer 11 and the second active layer 12 (see FIGS. 9 and 10) may be both of the second conductivity type opposite to that of the substrate 8, while the region 20 is of the same first conductivity type as the substrate 8 and, instead of in the first part I, extends locally in the mesa-shaped part II through the third passive layer 13, the second active layer 12 and a part of the second passive layer 11. FIGS. 9 and 10 are diagrammatic cross-sectional views of two examples of such an embodiment. In the first example, shown in FIG. 9, the region 20 extends from the edge of the semiconductor wafer and is spaced apart from the first part I and forms the first p-n junction 15 there. In the second example, shown in FIG. 10, the region 20 on its side remote from the first part I forms the first p-n junction 15 and extends from the junction between the parts I and II. In both examples a method other than proton bombardment has been chosen for current limiting of the DH-laser, namely an oxide strip contact on a surface which is otherwise covered by silicon oxide or another insulating layer 30, which strip contact may in addition be provided with a diffused or implanted contact zone 31 of the same conductivity type as the layer 11 but with a higher doping concentration so as to improve the contact resistance. Also, in contrast with the example of FIG. 1, the contact layer 14 has been omitted, assuming that the electrode layer 18 forms a sufficiently low-ohmic contact on the layer 13. The embodiments of FIGS. 9 and 10, as well as that shown in FIG. 1, may be manufactured using generally available semiconductor technology. Since the conductivity of p-type substrates of gallium arsenide at about the same doping concentration is worse than that of n-type substrates it is recommendable, as shown in FIGS. 9 and 10 by the shading, to use an n-type substrate 8 and also an n-type region 20 in these cases. When a GaAs-AlGaAs structure is used, the region 20 is difficult to form by diffusion or cannot be formed by diffusion. Therefore the region 20 will preferably be formed by contour epitaxy as already described above.

Figure 11:
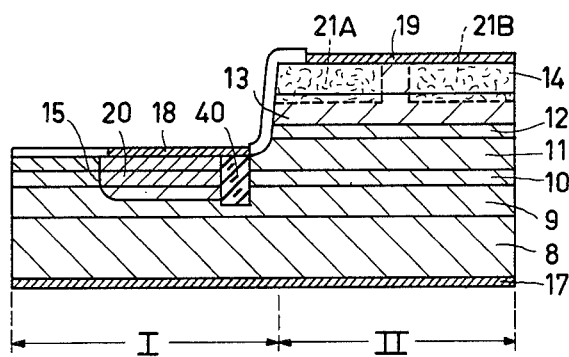
FIG. 11 is a diagrammatic cross-sectional view of a modified embodiment of the construction shown in FIG. 1.

It is furthermore to be noted that the embodiment of FIG. 1 can in certain circumstances also be varied advantageously as is shown in the diagrammatic cross-sectional view of FIG. 11. According to this modified embodiment in which the region 20 is bounded by an electrically insulating region 40 on the side of the second part II of the semiconductor wafer, the p-n junction 15 is formed on the side of the region 20 remote from the mesa-shaped second part II.

Although in the embodiments described, the p-n junction 16 of the conventional DH-laser coincides substantially with the hetero-junction between the active layers and one of the adjoining passive layers, this need not be the case. The p-n junction may also extend within the active layer 12 parallel to the interfaces with the passive layers.

Although only gallium arsenide and gallium aluminum arsenide have been mentioned as semiconductor materials in the examples described, other semiconductor materials suitable for the manufacture of lasers may also be used.

Figure 12:
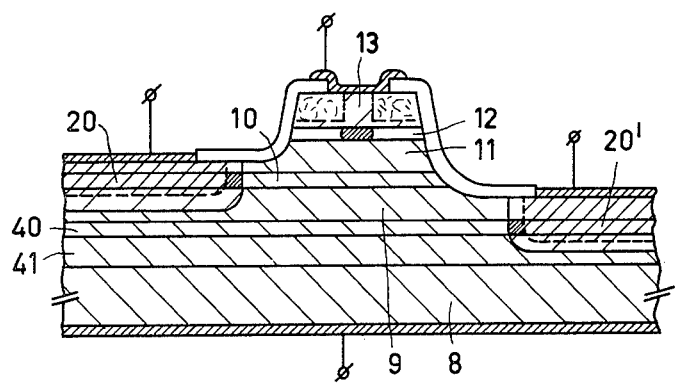
FIG. 12 is a diagrammatic cross-sectional view of a device having a conventional DH-laser and two TJS-lasers. The drawings are purely diagrammatic and not to scale. Corresponding parts are generally referred to by the same reference numerals. Semiconductor regions of the same conductivity type are shaded in the same direction in the cross-sectional views.

Finally, the semiconductor device according to the invention may also comprise more than two lasers. For example, the diagrammatic cross-sectional view of FIG. 12 shows a device having a conventional DH-laser and two TJS-lasers. The device comprises three active layers 40, 10 and 12 and may be constructed from the same materials as the FIG. 1 example, in which two extra layers, an N+ active layer 40 and an N passive layer 41, have been added, both of gallium aluminum arsenide. The device comprises two diffused regions 20 and 20'. By suitable choice of the material, three beams with three different frequencies can be generated herewith.

What is claimed is:

1. A semiconductor laser device for generating at least two radiation beams which are substantially parallel to each other, comprising a semiconductor wafer having a first and a second major surface and comprising, between said major surfaces and beside each other, at least a first part and an adjoining second part, which semiconductor wafer is further bounded by two substantially parallel reflecting side surfaces extending perpendicularly to the direction of the radiation beams and comprises a substrate of a first conductivity type adjoining the second major surface, on which substrate are provided successively a first passive layer of the first conductivity type, a first active layer and a second passive layer, which layers, together with the substrate, extend in both parts of the semiconductor wafer, and only in said second part there is provided on the second passive layer successively a second active layer and a third passive layer, each active layer being provided between passive layers having a larger forbidden band gap, the first active layer comprising a p-n junction in said first part and the second active layer comprising a p-n junction in said second part, each of which p-n junctions emits one of said radiation beams at a sufficiently high current, the substrate being connected to a first electrode, the second passive layer being connected to a second electrode, and the third passive layer being connected to a third electrode, characterized in that the third passive layer is of the second conductivity type and that in one of said parts of the semiconductor wafer a region is formed locally which extends from the first major surface through the uppermost passive layer, the adjoining active layer and a part of the underlying passive layer, the three layers all having the same conductivity type opposite to that of said region, said region forming with the remaining part of said adjoining active layer the first p-n junction extending transversely to said active layer and to said side surfaces, the second p-n junction extending parallel to the second major surface and comprising a strip-shaped active region also extending transversely to the side surfaces.

2. A semiconductor laser device as claimed in claim 1, characterized in that the two radiation beams have different frequencies.

3. A semiconductor laser device as claimed in claim 2, characterized in that the first p-n junction emits radiation of a higher frequency than the second p-n junction.

4. A semiconductor laser device as claimed in claim 1, 2 or 3, characterized in that the first active layer and the second passive layer are both of the first conductivity type, and the said region is of the second conductivity type and extends locally in the first part of the semiconductor wafer through the second passive layer, the first active layer and part of the first passive layer.

5. A semiconductor laser device as claimed in claim 4, characterized in that the region of the second conductivity type extends from the edge of the semiconductor wafer and is spaced from the second part of the semiconductor wafer, where it forms the first p-n junction.

6. A semiconductor laser device as claimed in claim 4, characterized in that the region of the second conductivity type on the side of the second part of the semiconductor wafer is bounded by an electrically insulating region and on the side remote from the second part forms the first p-n junction.

7. A semiconductor laser device as claimed in claim 1, 2 or 3, characterized in that the second passive layer and the second active layer are both of the second conductivity type, and the said region is of the first conductivity type and extends locally in the second part of the semiconductor wafer through the third passive layer, the second active layer and part of the second passive layer.

8. A semiconductor laser device as claimed in claim 7, characterized in that the region of the first conductivity type extends from the edge of the semiconductor wafer and is spaced from the first part of the semiconductor plate, where it forms the first p-n junction.

9. A semiconductor laser device as claimed in claim 7, characterized in that the region of the first conductivity type extends from the junction between the first and the second part of the semiconductor wafer and forms the first p-n junction on its side remote from the first part.

10. A semiconductor laser device as claimed in claim 1, 2 or 3, characterized in that the space between the surface of the second passive layer and the first major surface in the first part of the semiconductor wafer is occupied mainly by a contact metal.

11. A semiconductor laser device as claimed in claim 1, 2 or 3, characterized in that the said region is p-type conductive.

12. A semiconductor laser device as claimed in claim 1, 2 or 3, characterized in that the strip-shaped active region of the second p-n junction is bounded by proton-bombarded, electrically substantially insulating zones extending at least into the proximity of the associated active layer.

13. A semiconductor laser device as claimed in claim 1, 2 or 3, characterized in that an electrically insulating region which extends at least into the proximity of the first active layer is present between the said region and the adjoining one of said two parts of the semiconductor wafer.

* * * * *